(12) United States Patent
Ahn et al.

(10) Patent No.: US 9,166,183 B2
(45) Date of Patent: Oct. 20, 2015

(54) ORGANIC SOLAR CELL AND METHOD FOR PRODUCING THE SAME

(75) Inventors: Tae Hwan Ahn, Seoul (KR); Jung Seok Han, Seoul (KR); Chul Oh, Seoul (KR)

(73) Assignee: KOLON INDUSTRIES, INC., Gwacheon-si (KR)

( * ) Notice: Subject to any disclaimer, the term of this patent is extended or adjusted under 35 U.S.C. 154(b) by 0 days.

(21) Appl. No.: 13/319,669

(22) PCT Filed: Jun. 28, 2011

(86) PCT No.: PCT/KR2011/004689
§ 371 (c)(1),
(2), (4) Date: Nov. 9, 2011

(87) PCT Pub. No.: WO2012/002694
PCT Pub. Date: Jan. 5, 2012

(65) Prior Publication Data
US 2012/0111403 A1    May 10, 2012

(30) Foreign Application Priority Data
Jun. 29, 2010 (KR) .......................... 10-2010-0061620

(51) Int. Cl.
*H01L 51/46* (2006.01)
*H01L 51/42* (2006.01)
*H01L 51/00* (2006.01)

(52) U.S. Cl.
CPC ......... *H01L 51/4273* (2013.01); *H01L 51/0001* (2013.01); *H01L 51/0036* (2013.01);
(Continued)

(58) Field of Classification Search
CPC .............. Y02E 10/549; H01L 51/0001; H01L 51/4273; H01L 51/4213–51/4233; H01L 51/0036–51/0037; H01L 2251/303–2251/308; H01L 27/302; H01L 31/0725

USPC .......................................................... 136/263
See application file for complete search history.

(56) References Cited

U.S. PATENT DOCUMENTS 8,592,804 B2 * 11/2013 Rand et al. .................. 257/40
2007/0028961 A1 * 2/2007 Zhang et al. ................ 136/263
(Continued)

FOREIGN PATENT DOCUMENTS

| CN | 101521261 A | 9/2009 |
|---|---|---|
| CN | 101719421 A | 6/2010 |
| WO | WO 2011/056778 A2 | 5/2011 |

OTHER PUBLICATIONS

Hau et al. "Air-stable inverted flexible polymer solar cells using zinc oxide nanoparticles as an electron selective layer." Applied Physics Letters 92, 253301, 2008.*

(Continued)

*Primary Examiner* — James Lin
*Assistant Examiner* — Liesl C Baumann
(74) *Attorney, Agent, or Firm* — Birch, Stewart, Kolasch & Birch, LLP

(57) ABSTRACT

An organic solar cell which includes an anode and a cathode that are arranged to face each other, a photoactive layer that is disposed between the anode and the cathode and contains a hole acceptor and an electron acceptor in mixture, and a metal oxide nano thin film layer that is disposed between the cathode and the photoactive layer and contains a metal oxide having an average particle size of 10 nm or less and having a particle size distribution such that 90% by number or more of the particles relative to the total number of the metal oxide particles has a particle size in the range of ±4 nm with respect to the average particle size, and a method for producing an organic solar cell. The organic solar cell has improved efficiency, and increased service life.

12 Claims, 4 Drawing Sheets

(52) U.S. Cl.
CPC ......... *H01L51/0037* (2013.01); *H01L 51/4233* (2013.01); *H01L 2251/308* (2013.01); *Y02E 10/549* (2013.01)

(56) References Cited

U.S. PATENT DOCUMENTS

| | | | |
|---|---|---|---|
| 2007/0235753 A1* | 10/2007 | Debucquoy et al. | 257/113 |
| 2007/0246094 A1* | 10/2007 | Brabec et al. | 136/244 |
| 2008/0006324 A1* | 1/2008 | Berke et al. | 136/263 |
| 2008/0223445 A1 | 9/2008 | Marks et al. | |
| 2008/0264488 A1* | 10/2008 | Balasubramanian et al. | 136/263 |
| 2009/0126779 A1* | 5/2009 | Heeger et al. | 136/249 |
| 2009/0188558 A1* | 7/2009 | Jen et al. | 136/256 |
| 2009/0314350 A1* | 12/2009 | Jung et al. | 136/263 |
| 2010/0084011 A1* | 4/2010 | Forrest et al. | 136/255 |
| 2010/0193034 A1* | 8/2010 | Lee et al. | 136/263 |
| 2010/0326497 A1* | 12/2010 | Yang et al. | 136/249 |
| 2011/0030789 A1* | 2/2011 | Krebs | 136/258 |
| 2012/0060926 A1* | 3/2012 | Hsu et al. | 136/263 |
| 2012/0073639 A1* | 3/2012 | Park et al. | 136/255 |
| 2012/0097230 A1* | 4/2012 | Lee et al. | 136/255 |
| 2012/0132272 A1* | 5/2012 | Steirer et al. | 136/256 |
| 2012/0255616 A1* | 10/2012 | Lim et al. | 136/263 |
| 2013/0061930 A1* | 3/2013 | Atienzar | 136/263 |

OTHER PUBLICATIONS

Beek et al. "Hybrid Zinc Oxide Conjugated Polymer Bulk Heterojunction Solar Cells." J. Phys. Chem. B. 109, 2005, 9505-9516.*

Vaseem et al. "ZnO Nanoparticles: Growth, Properties, and Applications." In Metal Oxide Nanostructures and Their Applications. American Scientific Publishers, Mar. 2010. 1-36.*

Ju et al. "Study on the bulk junction type organic solar cells with double zinc oxide layer." Thin Solid Films 518, 2009, 786-790.*

Cai et al. "Polymer solar cells: Recent development and possible routes for improvement in performance." Solar Energy Materials & Solar Cells 94, 2010, 114-127.*

Huang et al. "Enhancing performance of organic-inorganic hybrid solar cells using a fullerene interlayer from all-solution processing." Solare Energy Materials & Solar Cells 94, pp. 182-186. Available online Sep. 15, 2009.*

Haase et al., "Photochemistry and Radiation Chemistry of Colloidal Semiconductors. 23. Electron Storage on ZnO Particles and Size Quantization," Journal of Physical Chemistry, vol. 92, No. 2, pp. 482-487 (1988).

* cited by examiner

ORGANIC SOLAR CELL AND METHOD FOR PRODUCING THE SAME

TECHNICAL FIELD

The present invention relates to an organic solar cell and a method for producing the same, and more particularly, to an organic solar cell including a metal oxide nano thin film formed between a cathode and a photoactive layer, and a method for producing the same.

BACKGROUND ART

Organic solar cells are solar cells having a structure which utilizes conjugated polymers in which double bonds are alternately arranged, such as polyparaphenylenevinylene (PPV), photosensitive low molecular weight compounds such as CuPc, perylene and pentacene, and organic semiconductor materials such as (6,6)-phenyl-$C_{61}$-butyric acid methyl ester (PCBM). The organic semiconductor materials described above can be designed as desired and can be synthesized into various derivatives, so that the organic solar cells have a potential for limitless advancement.

Organic solar cells fundamentally have a thin film type structure, and mainly use a transparent electrode made of indium tin oxide (ITO) as a cathode, and a metal electrode made of aluminum (Al) or the like, which has a low work function, as a cathode. The photoactive layer has a thickness of about 100 nm and has a bulk heterojunction structure in which a hole acceptor and an electron acceptor are co-present.

As the hole acceptor, a conjugated polymer having electric conductivity, such as PPV, is used, while fullerene is used as the electron acceptor. At this time, in order to collect without loss the electrons generated by light into the aluminum electrode through fullerene, a sufficient amount of fullerene must be mixed into the conjugated polymer. Therefore, a fullerene derivative such as PCBM described above can be used so that fullerene can be well mixed with the conjugated polymer.

When the conjugated polymer absorbs light, bound electron-hole pairs (excitons) are generated, and the electrons and holes thus generated are collected at the cathode and the cathode, respectively, via fullerene and the conjugated polymer.

The organic solar cells can be mass produced at low cost with easy processability, and have an advantage that since thin film production can be achieved by a roll-to-roll system, manufacture of large-sized electronic devices having flexibility is feasible.

However, in spite of such technical and economical advantages as described above, there are difficulties in the application of the organic solar cells into practical use because of their low efficiency. Therefore, active research for an improvement of efficiency is underway in the field of organic solar cells. So far, efficiency-related research has been focused on the selection of raw materials or the design of production process for the photoactive layer for effective utilization of absorbed light, or for the electron transport layer and the hole transport layer; the shape and structure of organic thin films intended to overcome low charge mobility; an increase in crystallinity, and the like.

DISCLOSURE OF INVENTION

Problem to be Solved by the Invention

It is an object of the present invention to provide an organic solar cell which has improved efficiency as a result of an increase in the rate of movement of holes, and which can block oxygen and moisture penetrating from the outside and prevent deterioration of the photoactive capability of the polymer contained in the photoactive layer due to oxygen and moisture, thereby having an increased service life.

It is another object of the present invention to provide a method for producing an organic solar cell, which can prevent the deterioration of performance of the organic solar cell caused by addition of organic dispersants, and can enhance the efficiency and characteristics of the organic solar cell.

Means for Solving Problem

According to an aspect of the present invention, there is provided an organic solar cell which includes an anode and a cathode that are arranged to face each other, a photoactive layer that is disposed between the anode and the cathode and contains a hole acceptor and an electron acceptor in mixture, and a metal oxide nano thin film layer that is disposed between the cathode and the photoactive layer and contains a metal oxide having an average particle size of 10 nm or less, wherein the metal oxide has a particle size distribution such that 90% by number or more of the particles relative to the total number of the metal oxide particles have a particle size in the range of ±4 nm with respect to the average particle size.

The metal oxide may have an average particle size of 1 to 8 nm.

The metal oxide may have a particle size distribution such that 90% by number or more of the particles relative to the total number of the metal oxide particles have a particle size in the range of ±2 nm with respect to the average particle size.

The metal oxide may be an oxide of any one metal selected from the group consisting of Ti, Zn, Sr, In, Ba, K, Nb, Fe, Ta, W, Sa, Bi, Ni, Cu, Mo, Ce, Pt, Ag, Rh, and combinations thereof.

The metal oxide nano thin film layer may have a thickness of 50 to 500 nm.

According to another aspect of the present invention, there is provided a method for producing an organic solar cell, the method including a step of forming an anode and a cathode that are arranged to face each other, a step of forming a photoactive layer that is disposed between the anode and the cathode and contains a hole acceptor and an electron acceptor in mixture, and a step of forming a metal oxide nano thin film layer between the cathode and the photoactive layer.

The step of forming a metal oxide nano thin film layer may include a step of adding a metal raw material and a basic additive to a solvent to prepare a mixed solution, a step of subjecting the mixed solution thus prepared to a low temperature reaction at 20° C. to 60° C. to produce a precipitate of a metal oxide, a step of dispersing the precipitate of the metal oxide thus produced in an organic solvent, and a step of applying the metal oxide dispersed in the organic solvent.

The metal raw material may be any one selected from the group consisting of a metal chloride, a metal acetate, a metal citrate, a metal (meth)acrylate, a metal bromide, a metal cyanide, a metal phosphate, a metal sulfate, a metal sulfide and combinations thereof.

The metal in the metal raw material may be any one metal selected from the group consisting of Ti, Zn, Sr, In, Ba, K, Nb, Fe, Ta, W, Sa, Bi, Ni, Cu, Mo, Ce, Pt, Ag, Rh, and combinations thereof.

The basic additive may be any one selected from the group consisting of alcohol amines, aqueous hydrogen peroxide, ammonium hydroxide, sodium hydroxide, potassium hydroxide, rubidium hydroxide, cesium hydroxide, magnesium hydroxide, calcium hydroxide, and combinations thereof.

The organic solvent may be any one selected from the group consisting of chloroform, chlorobenzene, dichlorobenzene, trichlorobenzene, tetrahydrofuran (THF), dimethylformamide (DMF), dimethylacetamide (DMAC), dimethyl sulfoxide (DMSO), toluene, an alcohol-based solvent, and combinations thereof.

The low temperature synthesis may be carried out for 2 to 10 hours.

The step of applying the metal oxide dispersed in an organic solvent may further include a step of calcining the metal oxide at 150° C. to 250° C. for 2 to 10 minutes, after the application process.

In the step of the preparing a mixed solution, the metal raw material and the basic additive may be added at a weight ratio of 5:1 to 1:3.

The metal oxide may have an average particle size of 10 nm, and the metal oxide may have a particle size distribution such that 90% by number or more of the particles relative to the total number of the metal oxide particles have a particle size in the range of ±4 nm with respect to the average particle size.

Hereinafter, exemplary embodiments of the present invention will be described in detail with reference to the attached drawings, so that those having ordinary skill in the art to which the present invention is pertained can easily carry out the present invention. However, the present invention may include various embodiments and modifications, and is not intended to be limited to the exemplary embodiments described herein.

FIG. 1 is a perspective diagram depicting an organic solar cell according to an embodiment of the present invention.

According to FIG. 1, the organic solar cell (100) includes an anode (160) and a cathode (120) that are arranged to face each other, a photoactive layer (140) that is disposed between the anode (160) and the cathode (120) and contains a hole acceptor and an electron acceptor in mixture, and a metal oxide nano thin film layer (170) that is formed between the cathode (120) and the photoactive layer (140).

The anode (160) and the cathode (120) are disposed on a substrate (110). There are no particular limitations on the substrate (110) as long as the substrate is transparent, and a transparent inorganic substrate made of quartz or glass, or a transparent plastic substrate made of any one selected from the group consisting of polyethylene terephthalate (PET), polyethylene naphthalate (PEN), polycarbonate (PC), polystyrene (PS), polypropylene (PP), polyimide (PI), polyethylene sulfonate (PES), polyoxymethylene (POM), polyether ether ketone (PEEK), polyether sulfone (PES), and polyether imide (PEI), can be used. Particularly, in regard to the transparent plastic substrate, a plastic substrate which is flexible and also has high chemical stability, high mechanical strength and transparency can be used with preference.

The substrate (110) may have a transmittance of at least 70% or higher, and preferably 80% or higher, to visible light having a wavelength of about 400 to 750 nm.

Since the cathode (120) serves as a path through which the light that has passed through the substrate (110) can reach the photoactive layer (140), it is preferable to use a material having high transparency, and it is preferable to use an electrically conductive material having a work function as high as about 4.5 eV or greater, and low resistance. Specific examples of the cathode-forming material that can be used to form the cathode (120) include a transparent oxide selected from the group consisting of tin-doped indium oxide (ITO), fluorine-doped tin oxide (FTO), $ZnO—Ga_2O_3$, $ZnO—Al_2O_3$, $SnO_2—Sb_2O_3$, and combinations thereof; an organic transparent electrode such as an electrically conductive polymer, a grapheme thin film, a grapheme oxide thin film, or a carbon nanotube thin film; and an organic-inorganic composite transparent electrode such as a carbon nanotube thin film composited with metal.

The anode (160) is preferably formed from a material having a low work function, and specific examples of the cathode-forming material may include any one selected from the group consisting of magnesium, calcium, sodium, potassium, titanium, indium, yttrium, lithium, aluminum, silver, tin, lead, stainless steel, copper, tungsten, and silicon.

The photoactive layer (140) has a bulk heterojunction structure in which a hole acceptor and an electron acceptor are mixed. The hole acceptor is an organic semiconductor such as an electrically conductive polymer or an organic low molecular weight semiconductor material. The electrically conductive polymer may be any one selected from the group consisting of polythiophene, polyphenylenevinylene, polyfluorene, polypyrrole, copolymers thereof, and combinations thereof, and the organic low molecular semiconductor material may be any one selected from the group consisting of pentacene, anthracene, tetracene, perylene, oligothiophene, derivatives thereof and combinations thereof.

Furthermore, the hole acceptor is preferably any one selected from the group consisting of poly-3-hexylthiophene [P3HT], poly-3-octylthiophene [P3OT], polyparaphenyelnevinylene [PPV], poly(9,9'-dioctylfluorene), poly(2-methoxy, 5-(2-ethyl-hexyloxy)-1,4-phenylenevinylene) [MEH-PPV], poly(2-methyl, 5-(3',7'-dimethyloctyloxy))-1,4-phenylenevinylene [MDMOPPV], and combinations thereof.

The electron acceptor may be nanoparticles of any one selected from the group consisting of fullerene ($C_{60}$), fullerene derivatives, CdS, CdSe, CdTe, ZnSe, and combinations thereof. The electron acceptor is preferably any one selected from the group consisting of (6,6)-phenyl-$C_{61}$-butyric acid methyl ester [PCBM], (6,6)-phenyl-$C_{71}$-butyric acid methyl ester [$C_{70}$-PCBM], (6,6)-thioenyl-$C_{61}$-butyric acid methyl ester [ThCBM], carbon nanotube, and combinations thereof.

The photoactive layer (140) is preferably formed from a mixture of P3HT as the hole acceptor and PCBM as the electron acceptor, and in this case, the mixing weight ratio of P3HT and PCBM may be 1:0.1 to 1:2.

The organic solar cell (100) can further include a hole transport layer (130) between the cathode (120) and the photoactive layer (140). The hole transport layer (130) may contain any one hole transporting material selected from the group consisting of poly(3,4-ethylenedioxythiophene) (PEDOT), poly(styrene sulfonate) (PSS), polyaniline, phthalocyanine, pentacene, polydiphenylacetylene, poly(t-butyl)diphenylacetylene, poly(trifluoromethyl)diphenylacetylene, copper phthalocyanine (Cu—PC) poly(bistrifluoromethyl)acetylene, polybis(t-butyldiphenyl)acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsilyl)phenylacetylene, derivatives thereof, and combinations thereof. Preferably, a mixture of PEDOT and PSS can be used.

The organic solar cell (100) can further include an electron transport layer (150) between the anode (160) and the photoactive layer (140). The electron transport layer (150) may contain any one electron transporting material selected from the group consisting of lithium fluoride, calcium, lithium, titanium oxide, and combinations thereof.

On the other hand, the organic solar cell (100) includes a metal oxide nano thin film layer (170) between the cathode (120) and the photoactive layer (140). The metal oxide nano thin film layer (170) can enhance the efficiency of the organic solar cell (100) by increasing the rate of movement of holes, and can block oxygen and moisture penetrating from the outside and thus prevent deterioration of the polymer contained in the photoactive layer (140) due to oxygen and moisture, thereby increasing the service life of the organic solar cell (100).

The metal oxide nano thin film layer (170) may have a thickness of 50 to 500 nm, preferably 50 to 300 nm, and more preferably 100 to 250 nm. When the thickness of the metal oxide nano thin film layer (170) is in the range described above, the rate of movement of holes can be enhanced, and the penetration of oxygen and moisture from the outside, which may eventually affect the photoactive layer and the hole transport layer, can be effectively prevented.

The metal oxide of the metal oxide nano thin film layer (170) may have an average particle size of 10 nm or less, preferably 1 to 8 nm, and more preferably 3 to 7 nm. Furthermore, the metal oxide may have a particle size distribution such that 90% by number or more, preferably 95% by number or more, and even more preferably 99% by number or more, of the metal oxide particles have a particle size in the range of ±4 nm, preferably in the range of ±3 nm, and more preferably in the range of ±2 nm, with respect to the average particle size.

The unit "percent (%) by number" means the proportion of the number of metal oxide particles that satisfy the particle size distribution condition relative to the total number of the metal oxide particles contained in the metal oxide nano thin film layer (170). The particle size and number of the metal oxide particles contained in the metal oxide nano thin film layer (170) can be analyzed by measuring the particle size of the metal oxide particles shown in transmission electron microscopic (TEM) photographs at various sites of the metal oxide nano thin film layer (170), and counting the numbers.

The metal oxide nano thin film layer (170) is formed by dispersing the metal oxide described above in an organic solvent and then applying the dispersion. When the metal oxide has an average particle size of 10 nm or less, and has a particle size distribution such that 90% by number or more of the particles relative to the total number of the metal oxide particles have a particle size in the range of ±4 nm with respect to the average particle size, the metal oxide particles are well dispersed in the organic solvent without adding any organic dispersant. Therefore, a decrease in the performance of the organic solar cell (100) caused by addition of an organic dispersant can be prevented, and the metal oxide having an average particle size and a particle size distribution in the ranges described above can further increase the rate of movement of holes, and can more efficiently block the oxygen and moisture penetrating from the outside.

The metal oxide may be an oxide of any one metal selected from the group consisting of Ti, Zn, Sr, In, Ba, K, Nb, Fe, Ta, W, Sa, Bi, Ni, Cu, Mo, Ce, Pt, Ag, Rh, and combinations thereof, and the metal oxide is preferably ZnO. Since ZnO has a wide bandgap and semiconductor properties, when ZnO is used together with the cathode (120), the movement of holes can be further improved.

FIG. 2 is a process flow diagram depicting the method for producing an organic solar cell according to another embodiment of the present invention. Now, the method for producing the organic solar cell (100) will be described below with reference to FIG. 2.

The cathode (120) can be formed on one surface of the substrate (110) using the cathode-forming material, to have a certain pattern by thermal vapor deposition, electron beam deposition, RF or magnetron sputtering, chemical deposition or methods similar to these (S10). After the formation of the cathode (120), the surface of the substrate (110) can be optionally treated using UV/O$_3$.

The metal oxide nano thin film layer (170) is formed on the cathode (120) (S20). The metal oxide nano thin film (170) can be produced through a step of adding a metal raw material and a basic additive to a solvent to prepare a mixed solution (S21), a step of subjecting the mixed solution thus prepared to a low temperature reaction at 20° C. to 60° C. to produce a precipitate of the metal oxide (S22), a step of dispersing the precipitate of the metal oxide thus produced in an organic solvent (S23), and a step of applying the metal oxide dispersed in the organic solvent (S24).

The method for forming the metal oxide nano thin film layer (170) (S20) can regulate the average particle size, particle size distribution and amount of precipitate of the metal oxide thus produced, by regulating the contents of the metal raw material and the basic additive, and as the ingredients are allowed to react at a low temperature of 20° C. to 60° C., the metal oxide particles thus produced have crystallinity.

In the step of preparing the mixed solution (S21), the mixed solution can be prepared by adding the metal raw material and the basic additive to the solvent, and mixing the ingredients. At this time, if the ingredients are allowed to react in the form of mixture, the mixture may be optionally heated to reflux. Any solvent can be used as the solvent for this purpose as long as it can dissolve both the metal raw material and the basic additive, and preferably, an alcohol-based solvent can be used. Examples of the alcohol-based solvent that can be used include ethanol, methanol, and isopropanol.

The metal raw material can be any one selected from the group consisting of a metal chloride, a metal acetate, a metal citrate, a metal (meth)acrylate, a metal bromide, a metal cyanide, a metal phosphate, a metal sulfate, a metal sulfide, and combinations thereof, and the metal can be any one selected from the group consisting of Ti, Zn, Sr, In, Ba, K, Nb, Fe, Ta, W, Sa, Bi, Ni, Cu, Mo, Ce, Pt, Ag, Rh, and combinations thereof. The metal raw material and the metal can be appropriately selected according to which material will be used to form the metal oxide nano thin film layer in the organic solar cell (100), and preferably zinc chloride or zinc acetate can be used.

The basic additive can be any one selected from the group consisting of alcohol amines, aqueous hydrogen peroxide, ammonium hydroxide, sodium hydroxide, potassium hydroxide, rubidium hydroxide, cesium hydroxide, magnesium hydroxide, calcium hydroxide, and combinations thereof, and examples of the alcohol amines that can be used include ethanolamine, methanolamine, and propanolamine. Particularly, any one selected from the group consisting of ammonium hydroxide, sodium hydroxide, potassium hydroxide, ethanolamine, methanolamine, and mixtures thereof can be used with preference as the basic additive. In the case of using these materials, it is preferable from the viewpoint that the particle shape and the size can be easily regulated, and the phenomenon of aggregation between nanoparticles can be suppressed.

In the step of preparing the mixed solution, the metal raw material and the basic additive can be added at a weight ratio of 5:1 to 1:3, preferably added at a weight ratio of 5:1 to 1:2, and more preferably added at a weight ratio of 3:1 to 1:1. When the amounts of addition of the metal raw material and the basic additive are in the ranges described above, a metal oxide which has an average particle size of 10 nm or less and has a particle size distribution such that 90% by number or more of the particles relative to the total number of the metal oxide particles have a particle size in the range of ±4 nm with respect to the average particle size, can be produced. A metal oxide having such characteristics is well dispersed in an organic solvent without any organic dispersant, so that deterioration of the performance of the organic solar cell (100) caused by addition of an organic dispersant can be prevented.

When the mixed solution thus prepared is subjected to a low temperature reaction, a precipitate of the metal oxide is produced (S22). Most of the metal oxide thus produced acquires crystallinity, and can prevent decreases in the efficiency and characteristics of the organic solar cell (100) that can occur in the case where the metal oxide does not have crystallinity.

The low temperature reaction can be achieved at 20° C. to 60° C. for 2 to 10 hours, preferably at 40° C. to 60° C. for 2 to 10 hours, and more preferably at 40° C. to 60° C. for 4 to 6 hours. When the temperature and time of the low temperature reaction are in the ranges described above, a metal oxide which mostly has crystallinity, has an average particle size of 10 nm or less, and has a particle size distribution such that 90% by number or more of the particles relative to the total number of the metal oxide particles has a particle size in the range of ±4 nm with respect to the average particle size, can be produced.

When the precipitate of the metal oxide thus produced is dispersed in an organic solvent (S23), and the metal oxide dispersed in the organic solvent is applied on the cathode (120) (S24), the metal oxide nano thin film layer (170) can be produced.

The organic solvent used to dissolve the precipitate of the metal oxide can be any one selected from the group consisting of chloroform, chlorobenzene, dichlorobenzene, trichlorobenzene, tetrahydrofuran (THF), dimethylformamide (DMF), dimethylacetamide (DMAC), dimethyl sulfoxide (DMSO), toluene, an alcohol-based solvent, and combinations thereof.

In regard to the method of applying the metal oxide on the cathode (120), any coating method that is conventionally used can be used, and specifically, the application can be achieved by methods such as spraying, spin coating, dipping, printing, doctor blade coating, and sputtering.

The metal oxide nano thin film layer (170) has a thickness of 50 to 500 nm, preferably 50 to 300 nm, and more preferably 100 to 250 nm. When the thickness of the metal oxide nano thin film layer is in the range described above, the rate of movement of holes can be enhanced, and also, penetration of oxygen and moisture from the outside can be effectively prevented.

After the metal oxide dispersed in the organic solvent is applied on the cathode (120), the metal oxide nano thin film layer (170) can be optionally calcined. The calcination is achieved at 150° C. to 250° C. for 2 to 10 minutes only to the extent of removing the organic solvent, and since the metal oxide synthesized by the low temperature reaction has crystallinity, additional calcination for imparting crystallinity is not required.

Optionally, a hole transport layer (130) can be formed on the cathode (120) (S30). The hole transport layer (13) can be formed by applying the hole transporting material by a method such as spraying, spin coating, dipping, printing, doctor blade coating, or sputtering, or by an electrophoretic method. The thickness of the hole transport layer (13) is preferably 5 to 2000 nm.

Next, the photoactive layer (140) is formed on the cathode (120) or the hole transport layer (130) (S40). The photoactive layer (140) can be formed by applying a mixture prepared by dissolving the electron acceptor and the hole acceptor in a solvent, by a method such as spraying, spin coating, dipping printing, doctor blade coating or sputtering, or by an electrophoretic method. The thickness of the photoactive layer (140) is preferably 5 to 2000 nm.

The photoactive layer (140) can be produced through a drying process at 25° C. to 150° C. for 5 to 145 minutes, and a heat treatment process. When the drying process and the heat treatment process are appropriately controlled, appropriate phase separation between the electron acceptor and the hole acceptor can be induced, and the orientation of the electron acceptor can be induced. In the case of the heat treatment process, if the temperature is lower than 25° C., the mobility of the electron acceptor and the hole acceptor is so low that the effect of the heat treatment may be negligible. If the heat treatment temperature is higher than 150° C., the performance may be decreased due to deterioration of the electron acceptor. Furthermore, if the heat treatment time is shorter than 5 minutes, the mobility of the electron acceptor and the hole acceptor is so low that the effect of the heat treatment may be negligible. If the heat treatment time is longer than 145 minutes, the performance may be decreased due to deterioration of the electron acceptor.

Optionally, an electron transport layer (150) can be formed on the photoactive layer (140). The electron transport layer (150) can be formed by applying the electron transporting material by a method such as spraying, spin coating, dipping, printing, doctor blade coating, or sputtering, or by an electrophoretic method. The thickness of the electron transport layer (150) is preferably 5 to 2000 nm.

Finally, the anode (160) can be formed on the photoactive layer (140) or the electron transport layer (150), by depositing the cathode-forming material by thermal vapor deposition, electron beam deposition, RF or magnetron sputtering, chemical deposition, or methods similar to these (S60).

The operation of the organic solar cell (100) will be briefly described below.

Light coming from an external light source enters the photoactive layer (140) through the cathode (120). Since the substrate (110), the cathode 9120) and the hole transport layer (130) are all transparent, light can pass through these layers and enter the photoactive layer (140).

Photons constituting the incident light collide with the electrons in the valence band that is present in the electron acceptor of the photoactive layer (140). Electrons in the valence band receive energy corresponding to the wavelength of the photons from the photons that have collided with the electrons, and jump to the conduction band. As the electrons in the valence band jump to the conduction band, holes remain in the valence band.

The holes left in the electron acceptor pass through the hole transport layer (130) and move toward the cathode (120), and the electrons in the conduction band pass through the electron transport layer (150) and move toward the anode (160). The electrons and holes that have moved to the respective electrodes cause the organic solar cell (100) to have an electromotive force, and the organic solar cell operates as an electric power source.

At this time, the metal oxide nano thin film layer (170) enhances the efficiency of the organic solar cell (100) by increasing the rate of movement of holes, and blocks oxygen and moisture penetrating from the outside and prevents deterioration of the photoactive capability of the polymer contained in the photoactive layer (140) due to oxygen and moisture, thereby increasing the service life of the organic solar cell (100).

Effect of the Invention

The organic solar cell according to an embodiment of the present invention has improved efficiency as a result of an increase in the rate of movement of holes, and can block oxygen and moisture penetrating from the outside and prevent deterioration of the photoactive capability of the polymer contained in the photoactive layer due to oxygen and moisture, thereby having an increased service life.

Furthermore, the method for producing an organic solar cell according to another embodiment of the present invention can prevent deterioration of the performance of the organic solar cell due to addition of an organic dispersant, by not adding any organic dispersant at the time of producing a metal oxide nano thin film layer, and can enhance the efficiency and characteristics of the organic solar cell by using a metal oxide having crystallinity.

BEST MODE(S) FOR CARRYING OUT THE INVENTION

Figure 1:
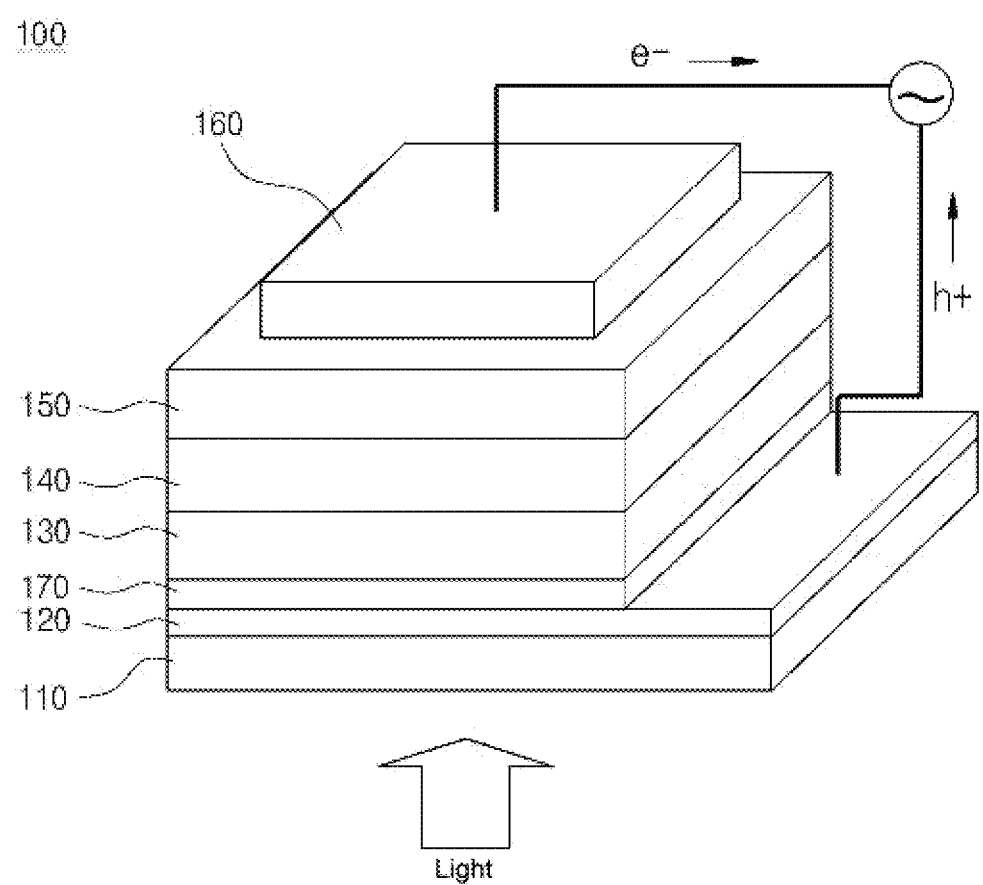
FIG. 1 is a perspective view showing the organic solar cell according to an embodiment of the present invention.
Figure 2:
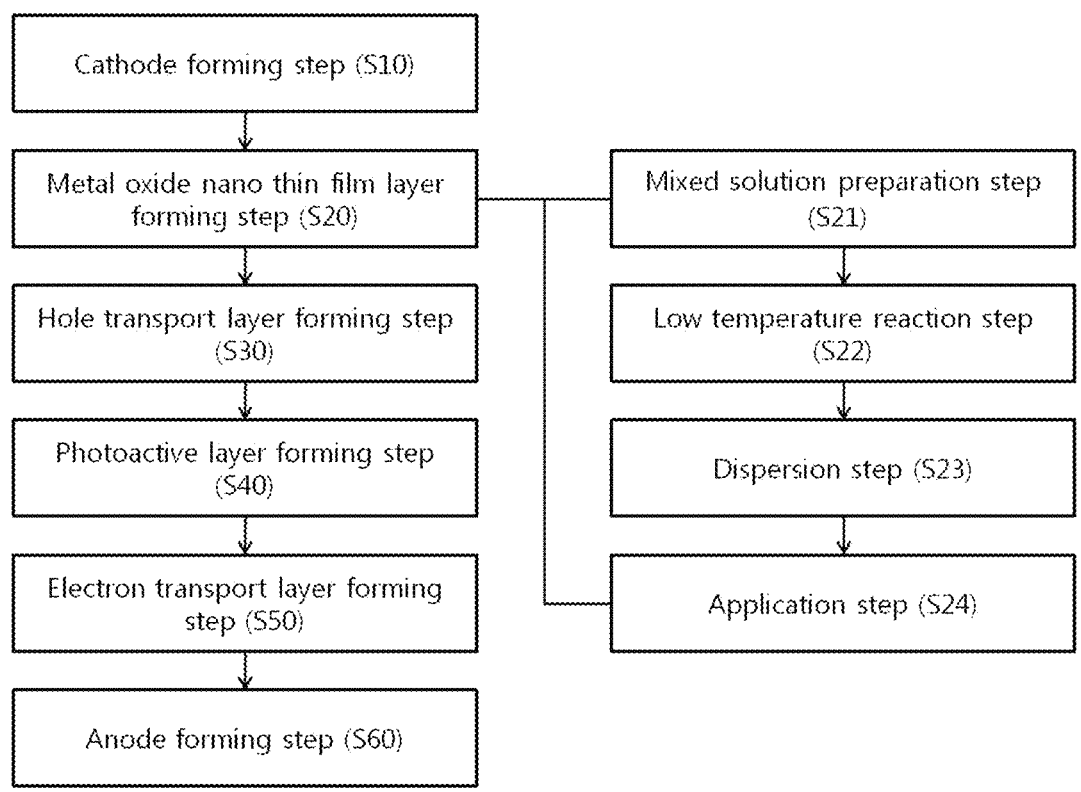
FIG. 2 is a process flow diagram showing the method for producing an organic solar cell according to another embodiment of the present invention.

Hereinafter, Examples of the present invention will be described in detail so that those having ordinary skill in the art to which the present invention is pertained can easily carry out the present invention. However, the present invention may include various embodiments and modifications, and is not intended to be limited to the Examples described herein.

PRODUCTION EXAMPLE

Production of Organic Solar Cell

Example 1

An ITO substrate having a transparent electrode patterned thereon was washed with an ultrasonic cleaning machine and dried using a hot air dryer, and then the substrate was surface treated using a UV/$O_3$ cleaner.

On the other hand, 3 g of zinc acetate (Zn acetate) and 3 g of a potassium hydroxide basic additive were added to 250 ml of an alcohol solvent, and the mixture was sealed and then stirred. Thus, a mixed solution was prepared. The mixed solution thus prepared was subjected to a low temperature reaction at 40° C. for 6 hours, and thus 2 g of a precipitate of ZnO was produced. The ZnO precipitate thus produced was collected and redispersed in 5 ml of chlorobenzene without any organic dispersant, and then the dispersion was applied on the ITO substrate by spin coating at 1600 rpm for 30 seconds. Thus, a metal oxide nano thin film layer was formed to a thickness of 220 nm. After the metal oxide nano thin film layer was formed, the ITO substrate was heated on a hot plate at 200° C. for 4 minutes, and thereby the solvent remaining in the nano thin film layer was all removed.

PEDOT:PSS [poly(3,4-ethylenedioxythiophene)/poly (styrene sulfonate)] was applied on the metal oxide nano thin film layer by spin coating at a rate of 4000 rpm for 30 seconds. This coated device was dried on a hot plate at 120° C. for about 25 minutes in a nitrogen atmosphere, and thus a hole transport layer was formed. A P3HT:PCBM blend solution was applied on the substrate where the hole transport layer was formed, by spin coating at 800 rpm for 30 seconds.

The P3HT:PCBM blend solution was prepared by dissolving P3HT and PCBM in a chlorobenzene solvent in amounts of 25 g/L and 20 g/L, respectively, based on the total weight of the blend solution, and gold (Au) nanoparticles which had a particle size of 5 nm and had been surface treated with a thiol group, were dissolved to a concentration of 0.005% by weight based on the total weight of the photoactive layer produced. Subsequently, the solution was mixed using a magnetic stirrer and a vortex, at normal temperature for 30 minutes.

After a thin film of the P3HT:PCBM blend was formed, in order to remove the solvent remaining in the thin film and to obtain a crystalline structure of the active layer polymer, the thin film was subjected to drying for one hour at normal temperature in a nitrogen atmosphere, and to a heat treatment for about 20 minutes. After the heat treatment was completed, LiF and Al were deposited by vacuum thermal deposition, and thus an organic solar cell was produced.

Example 2

An organic solar cell was produced in the same manner as in Example 1, except that 3 g of Zn acetate and 1.5 g of the potassium hydroxide basic additive used in Example 1 were added to 250 ml of an alcohol solvent, the mixture was sealed and then stirred to prepare a mixed solution, and subsequently, the mixed solution thus prepared was subjected to a low temperature reaction at 40° C. for 6 hours to produce a precipitate of ZnO.

Example 3

An organic solar cell was produced in the same manner as in Example 1, except that 3 g of Zn acetate and 1.5 g of the potassium hydroxide basic additive used in Example 1 were added to 250 ml of an alcohol solvent, the mixture was sealed and then stirred to prepare a mixed solution, and subsequently, the mixed solution thus prepared was subjected to a low temperature reaction at 60° C. for 6 hours to produce a precipitate of ZnO.

Example 4

An organic solar cell was produced in the same manner as in Example 1, except that titanium butoxide (Ti butoxide) was used instead of the Zn acetate used in Example 1, and was subjected to the low temperature reaction to produce $TiO_2$.

Example 5

An organic solar cell was produced in the same manner as in Example 1, except that tetraethyl ortho-silicate was used instead of the Zn acetate used in Example 1, and was subjected to the low temperature reaction to produce $SiO_2$.

Example 6

An organic solar cell was produced in the same manner as in Example 1, except that iron chloride (Fe chloride) was used instead of the Zn acetate used in Example 1, and was subjected to the low temperature reaction to produce $Fe_2O_3$.

Comparative Example 1

An organic solar cell was produced in the same manner as in Example 1, except that 3 g of Zn acetate and 5 g of the potassium hydroxide basic additive used in Example 1 were added to 250 ml of an alcohol solvent, the mixture was sealed and then stirred to prepare a mixed solution, and subsequently, the mixed solution thus prepared was subjected to a low temperature reaction at 15° C. for 6 hours to produce a precipitate of ZnO.

Comparative Example 2

An organic solar cell was produced in the same manner as in Example 1, except that 3 g of Zn acetate and 3 g of an ammonium hydroxide basic additive were added to 250 ml of an alcohol solvent, the mixture was sealed and then stirred to prepare a mixed solution, and subsequently, the mixed solution thus prepared was subjected to a low temperature reaction at 65° C. for 6 hours to produce a precipitate of ZnO.

Experimental Example 1

Analysis of Characteristics of Produced Metal Oxide

Figure 3A:
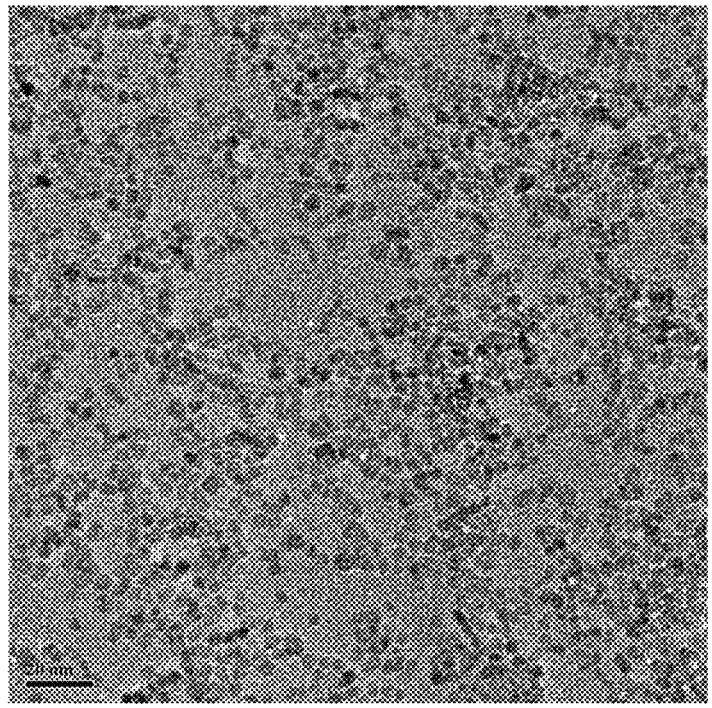
FIG. 3a and FIG. 3b are high resolution transmission electron microscopic (HR-TEM) photographs of the metal oxide produced in Example 1 of the present invention.
Figure 3B:
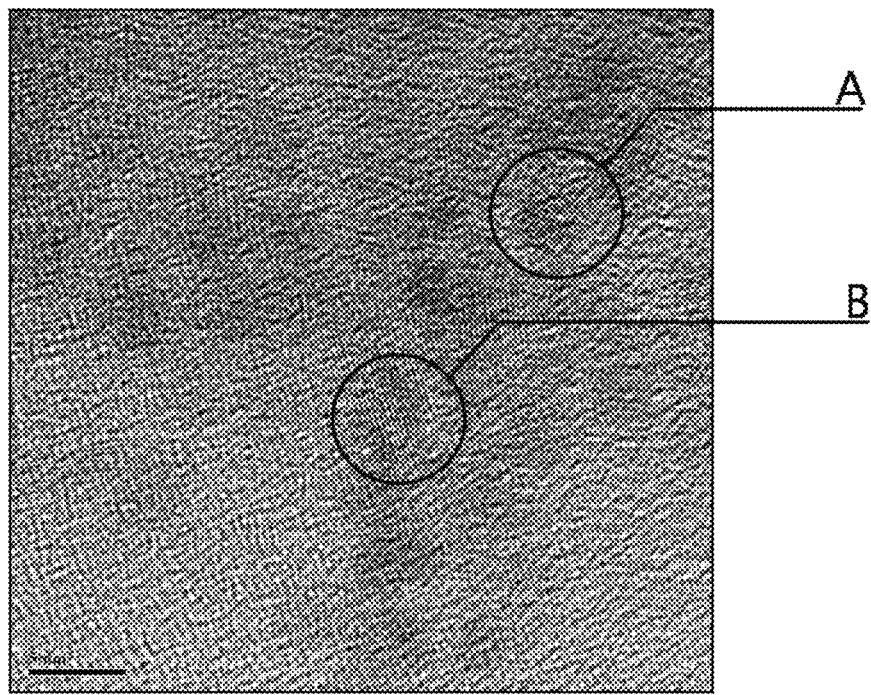

ZnO produced in Example 1 was dispersed in chlorobenzene, and then the dispersion was observed with a high resolution transmission electron microscope (JEM-3010, product of JEOL, Ltd.). The results are presented in the following FIG. 3a and FIG. 3b. FIG. 3a is a photograph taken at a magnification of 20 nm, and FIG. 3b is a photograph taken at a magnification of 5 nm. Furthermore, the areas A and B indicated in FIG. 3b represent the crystal structure of ZnO.

According to FIG. 3a and FIG. 3b, ZnO produced in Example 1 of the present invention is well dispersed in the organic solvent even without an organic dispersant, and it can be confirmed that most of ZnO has a crystalline structure.

Furthermore, for the metal oxides produced in Examples 1 to 3 and Comparative Examples 1 and 2, the average particle sizes and the particle size distributions of 95% by number or more relative to the total number of the metal oxide particles were measured, and the results are presented in the following Table 1. The particle size distribution was obtained by measuring the particle size of the metal oxide particles in plural TEM photographs taken at various sites of the metal oxide nano thin film layer, and counting the number of the particles.

TABLE 1

| | Example 1 | Example 2 | Example 3 | Comparative Example 1 | Comparative Example 2 |
|---|---|---|---|---|---|
| Average particle size (nm) | 5 | 2 | 10 | 5 | 11 |
| Particle size distribution (nm) | ±2 | ±1 | ±4 | ±5 | ±2 |

According to Table 1, it was found that the metal oxides produced in Examples 1 to 3 have an average particle size of 10 nm or less, and have a particle size distribution such that 90% by number or more of the particles relative to the total number of the metal oxide particles have a particle size in the range of (the average particle size±4 nm). It was also found that in the case of Comparative Example 1, the average particle size was 5 nm, but the particle size distribution was (the average particle size±5 nm), and in the case of Comparative Example 2, the size distribution was (the average particle size±2 nm), but the average particle size was 11 nm.

Experimental Example 2

Analysis of Performance of Produced Organic Solar Cell

The current-voltage characteristics of the solar cells were analyzed using a solar simulator (66984 by Newport Corporation), and the results are presented in the following Table 2. Furthermore, a short-circuit current (Isc)-open-circuit voltage (Voc) graph of the organic solar cell produced in Example 1 is presented in the following FIG. 4.

The solar simulator used a 300-W xenon lamp (6258 by Newport Corporation) and an AM 1.5G filter (81088A by Newport Corporation), and the intensity of light was set to 100 mW/cm$^2$.

TABLE 2

| | Example 1 | Example 2 | Example 3 | Comparative Example 1 | Comparative Example 2 |
|---|---|---|---|---|---|
| Energy conversion efficiency (%) | 1.56 | 0.92 | 0.77 | 0.92 | 0.53 |
| Short-circuit current density (mA/cm$^2$) | 4.8 | 5.1 | 4.72 | 5.13 | 2.5 |
| Open-circuit voltage (V) | 0.76 | 0.78 | 0.77 | 0.78 | 0.65 |

Figure 4:
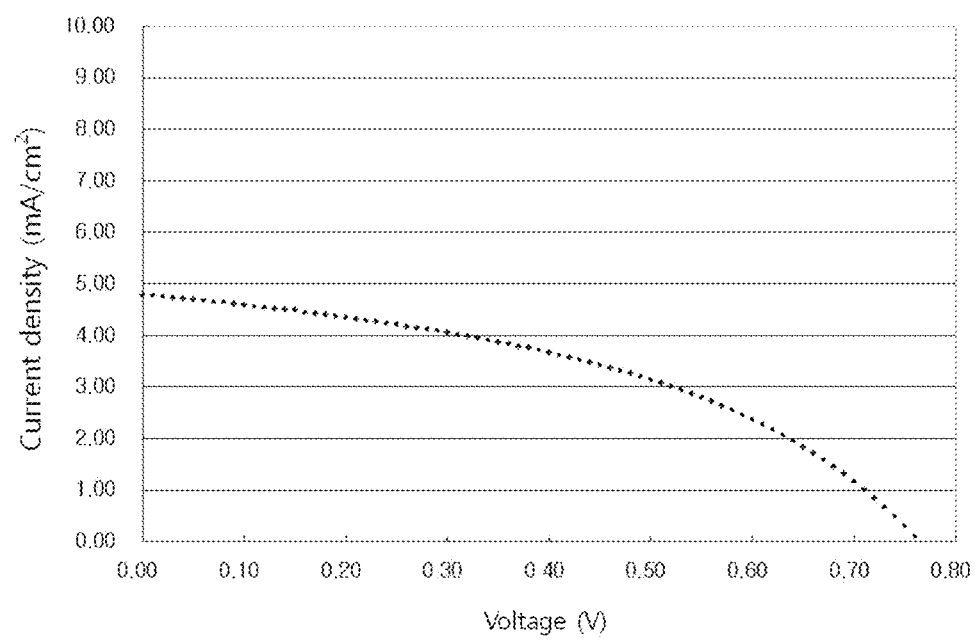
FIG. 4 is a short circuit current-open circuit voltage graph of the organic solar cell produced in Example 1 of the present invention.

According to FIG. 4, it was found that the organic solar cell produced in Example 1 has an increased open-circuit voltage as a result of introducing the metal oxide nano thin film layer.

According to Table 2, it was found that the performance of the organic solar cells produced in Examples 1 to 3 is superior to the performance of the organic solar cells produced in Comparative Examples 1 and 2. This is speculated to be because the organic solar cells produced in Examples 1 to 3 have metal oxide nano thin film layers which contain metal oxide particles having an average particle size of 10 nm or less and a particle size distribution such that 90% by number or more of the particles relative to the total number of the metal oxide particles have a particle size equivalent to (the average particle size±4 nm).

Thus, preferred embodiments of the present invention have been described in detail, but the scope of the present invention is not intended to be limited to the embodiments, and various modifications and improvements utilizing the fundamental idea of the present invention as defined in the following claims are also included in the scope of the present invention.

The invention claimed is:

1. An organic solar cell comprising:
    a metal electrode as an anode and a transparent electrode as a cathode that are arranged to face each other;
    a photoactive layer that is disposed between the anode and the cathode and contains a mixture of poly-3-hexylthiophene (P3HT) as a hole acceptor and (6,6)-phenyl-C61-butyric acid methyl ester (PCBM) as an electron acceptor;

a hole transport layer that is disposed between the cathode and the photoactive layer and contains a mixture of poly(3,4-ethylenedioxythiophene) (PEDOT) and poly(styrene sulfonate) (PSS); and a metal oxide nano thin film layer that is disposed between the cathode and the hole transport layer and contains a metal oxide having an average particle size of 3 to 7 nm, wherein the metal oxide nano thin film layer has a thickness of 50 nm to 500 nm, wherein the metal oxide has a particle size distribution such that 90% by number or more of the particles relative to the total number of the metal oxide particles have a particle size in the range of ±4 nm with respect to the average particle size, and wherein the metal oxide nano thin film layer is in direct physical contact with the cathode and the hole transport layer.

2. The organic solar cell according to claim 1, wherein the metal oxide is an oxide of any one metal selected from the group consisting of Ti, Zn, Sr, In, Ba, K, Nb, Fe, Ta, W, Sa, Bi, Ni, Cu, Mo, Ce, Pt, Ag, Rh, and combinations thereof.

3. The organic solar cell according to claim 1, wherein the metal oxide has a particle size distribution such that 90% by number or more of the particles relative to the total number of the metal oxide particles have a particle size in the range of ±2 nm with respect to the average particle size.

4. The organic solar cell according to claim 1, wherein the metal oxide nano thin film layer has a thickness of 220 to 500 nm.

5. A method for producing the organic solar cell of claim 1, the method comprising the steps of:

forming the anode and the cathode that are arranged to face each other;

forming the photoactive layer that is disposed between the anode and the cathode;

forming the hole transport layer that is disposed between the cathode and the photoactive layer; and forming the metal oxide nano thin film layer between the cathode and the hole transport layer, wherein the step of forming the metal oxide nano thin film layer further comprises the steps of:

adding a metal raw material and a basic additive to a solvent and preparing a mixed solution, subjecting the mixed solution to a low temperature reaction at 20° C. to 60° C. and thereby producing a precipitate of the metal oxide, dispersing the precipitate of the metal oxide in an organic solvent, and applying the metal oxide dispersed in the organic solvent on the cathode.

6. The method for producing the organic solar cell according to claim 5, wherein the metal raw material is any one selected from the group consisting of a metal chloride, a metal acetate, a metal citrate, a metal (meth)acrylate, a metal bromide, a metal cyanide, a metal phosphate, a metal sulfate, a metal sulfide, and combinations thereof.

7. The method for producing the organic solar cell according to claim 6, wherein the metal in the metal raw material is any one selected from the group consisting of Ti, Zn, Sr, In, Ba, K, Nb, Fe, Ta, W, Sa, Bi, Ni, Cu, Mo, Ce, Pt, Ag, Rh, and combinations thereof.

8. The method for producing the organic solar cell according to claim 5, wherein the basic additive is any one selected from the group consisting of alcohol amines, aqueous hydrogen peroxide, ammonium hydroxide, sodium hydroxide, potassium hydroxide, rubidium hydroxide, cesium hydroxide, magnesium hydroxide, calcium hydroxide, and combinations thereof.

9. The method for producing the organic solar cell according to claim 5, wherein the organic solvent is any one selected from the group consisting of chloroform, chlorobenzene, dichlorobenzene, trichlorobenzene, tetrahydrofuran (THF), dimethylformamide (DMF), dimethylacetamide (DMAC), dimethyl sulfoxide (DMSO), toluene, an alcohol-based solvent, and combinations thereof.

10. The method for producing the organic solar cell according to claim 5, wherein the low temperature reaction is carried out for 2 to 10 hours.

11. The method for producing the organic solar cell according to claim 5, wherein the step of applying the metal oxide dispersed in the organic solvent further includes a step of calcining the metal oxide at 150° C. to 250° C. for 2 to 10 minutes after applying the metal oxide.

12. The method for producing the organic solar cell according to claim 5, wherein in the step of preparing the mixed solution, the metal raw material and the basic additive are added at a weight ratio of 5:1 to 1:3.

\* \* \* \* \*